United States Patent
Ogilvie et al.

(10) Patent No.: US 8,453,110 B2
(45) Date of Patent: May 28, 2013

(54) AUTOMATIC GENERATION OF CODE FOR COMPONENT INTERFACES IN MODELS

(75) Inventors: Brian K. Ogilvie, Holliston, MA (US); Zhihong Zhao, Salem, NH (US); Bharath Venkataraman, Sudbury, MA (US)

(73) Assignee: The MathWorks, Inc., Natick, MA (US)

( * ) Notice: Subject to any disclaimer, the term of this patent is extended or adjusted under 35 U.S.C. 154(b) by 119 days.

(21) Appl. No.: 13/030,242

(22) Filed: Feb. 18, 2011

(65) Prior Publication Data

US 2011/0145784 A1 Jun. 16, 2011

Related U.S. Application Data

(63) Continuation of application No. 11/012,936, filed on Dec. 14, 2004, now Pat. No. 7,913,222.

(60) Provisional application No. 60/611,909, filed on Sep. 20, 2004.

(51) Int. Cl.
*G06F 9/44* (2006.01)

(52) U.S. Cl.
USPC .......................... 717/106; 717/104; 717/135

(58) Field of Classification Search
None
See application file for complete search history.

(56) References Cited

U.S. PATENT DOCUMENTS

| | | | |
|---|---|---|---|
| 6,058,263 A | 5/2000 | Voth | |
| 6,553,554 B1 | 4/2003 | Dahl et al. | |
| 6,564,363 B1 | 5/2003 | Dahl et al. | |
| 6,718,421 B1 | 4/2004 | Conroy | |
| 6,996,799 B1 * | 2/2006 | Cismas et al. | 717/104 |
| 7,206,732 B2 * | 4/2007 | Williams et al. | 717/135 |
| 7,272,546 B1 | 9/2007 | Brown et al. | |
| 7,523,023 B1 * | 4/2009 | Koh et al. | 717/156 |
| 7,900,188 B2 * | 3/2011 | Costa et al. | 717/106 |
| 7,913,222 B2 * | 3/2011 | Ogilvie et al. | 717/106 |
| 7,974,825 B2 * | 7/2011 | Linebarger et al. | 717/104 |
| 8,260,598 B2 * | 9/2012 | Yang et al. | 717/106 |
| 2002/0183998 A1 * | 12/2002 | Shakeri et al. | 703/22 |
| 2003/0195732 A1 | 10/2003 | Kodosky et al. | |
| 2004/0148151 A1 * | 7/2004 | Menter et al. | 717/135 |
| 2004/0162805 A1 * | 8/2004 | Wozniak | 707/1 |
| 2005/0216247 A1 | 9/2005 | Ikeda et al. | |

(Continued)

OTHER PUBLICATIONS

Simulink—Simulation and Model-Based Design, Jun. 2004, Version 6, The MathWorks, Inc., pp. 1-456; <http://users.isr.ist.utl.pt/~alex/micd0506/simulink.pdf>.*

(Continued)

*Primary Examiner* — Thuy Dao
*Assistant Examiner* — Ben C Wang
(74) *Attorney, Agent, or Firm* — Harrity & Harrity, LLP

(57) ABSTRACT

Methods, systems and computer program products are disclosed for automatically generating hardware description language code from a model. The hardware description language code may be generated from a graphical program/model, such as a block diagram model. The hardware description language code may also be generated from a text-based program/model, such as a model created using MATLAB® tools. In particular, the present invention provides for the automatic code generation of an interface between components in the model. The present invention may provide options for selecting at least one of multiple types or styles of the component interfaces in the model. The selection of the interface types or styles may be controlled by the user or inferred by other parameters, such as implementation parameters.

17 Claims, 4 Drawing Sheets

U.S. PATENT DOCUMENTS

| | | | |
|---|---|---|---|
| 2006/0064669 A1* | 3/2006 | Ogilvie et al. | 717/106 |
| 2008/0098349 A1* | 4/2008 | Lin et al. | 717/106 |
| 2008/0127057 A1* | 5/2008 | Costa et al. | 717/106 |
| 2008/0141227 A1 | 6/2008 | Waters et al. | |
| 2008/0222580 A1* | 9/2008 | Banerjee et al. | 716/18 |
| 2009/0007064 A1* | 1/2009 | Yang et al. | 717/106 |
| 2009/0013301 A1* | 1/2009 | Ogilvie et al. | 716/18 |
| 2011/0041106 A1* | 2/2011 | Li et al. | 716/106 |

OTHER PUBLICATIONS

Moutinho et al., "Automatic Generation of Graphical User Interfaces for VHDL based Controllers", 2011 IEEE, pp. 1491-1496; <http://ieeexplore.ieee.org/stamp/stamp.jsp?tp=&arnumber=5984381>.*

Bombieri et al., "HIFSuite: Tools for HDL Code Conversion and Manipulation", 2010 IEEE, pp. 40-41; <http://ieeexplore.ieee.org/stamp/stamp.jsp?tp=&arnumber=5496665>.*

Kintali et al., "Model-Based Design with Simulink, HDL Coder, and Xilinx System Generator for DSP"; 2012 The MathWorks, Inc., pp. 1-15; <http://www.mathworks.com/tagteam/74244_92077v00_Xilinx_WhitePaper_final.pdf>.*

Guo et al., "Efficient Hardware Code Generation for FPGAs", 2008 ACM, ACM Transactions on Architecture and Code Optimization, vol. 5, No. 1, Article 6, May 2008, pp. 1-26; <http://dl.acm.org/citation.cfm?id=1369396.1369402&coll=DL&dl=GUIDE&CFID=265032917&CFTOKEN=96850297>.*

U.S. Appl. No. 11/012,936, filed Dec. 14, 2004 entitled "Automatic Generation of Code for Component Interfaces in Models" by Brian K. Ogilvie et al., 27 pages.

Donno et al., "Power-Aware Clock Tree Planning," Apr. 18, 2004, ACM, pp. 138-147.

Donno et al., "Clock-Tree Power Optimization Based on RTL Clock-Gating," Jun. 2, 2003, ACM, pp. 622-627.

Matthias Gries, "Methods for Evaluating and Covering the Design Space During Early Design Development," Jun. 3, 2004, Elsevier, pp. 131-183.

Choi et al., "Exploiting Intellectual Properties in ASIP Designs for Embedded DSP Software," 1999 ACM, pp. 939-944.

Wingard et al.," Integration Architecture for System-On-A-Chip Design," 1998 IEEE, pp. 85-88 (International Search Report—PCT/US2005/033848).

D'Silva,"Bridge Over Troubled Wrappers: Automated Interface Synthesis," 2004 IEEE, pp. 1-6 (International Search Report—PCT/US2005/033848).

International Search Report for Application No. PCT/US2005/033848, dated Apr. 21, 2006.

* cited by examiner

|  | Interface A | Interface B | Interface C |
|---|---|---|---|
| Low Power | ✓ |  | ✓ |
| High Clock Rate | ✓ | ✓ |  |
| Low Implementation Area |  | ✓ | ✓ |

*Fig. 7*

AUTOMATIC GENERATION OF CODE FOR COMPONENT INTERFACES IN MODELS

RELATED APPLICATIONS

The present application is a continuation of U.S. patent application Ser. No. 11/012,936 filed Dec. 14, 2004 now U.S. Pat. No. 7,913,222, which claims priority to U.S. Patent Application No. 60/611,909 filed Sep. 20, 2004, the contents of both of which are incorporated herein by reference.

FIELD OF THE INVENTION

The present invention relates generally to code generation and more particularly to methods, systems and computer program products for automatically generating code for component interfaces in a model.

BACKGROUND OF THE INVENTION

Historically, engineers and scientists have utilized text-based or graphical programs/models in numerous scientific areas such as Feedback Control Theory and Signal Processing to study, design, debug, and refine dynamic systems. Dynamic systems, which are characterized by the fact that their behaviors change over time, are representative of many real-world systems. Text-based or graphical programming/modeling has become particularly attractive over the last few years with the advent of software packages, such as MATLAB®, and Simulink®, both from The MathWorks, Inc. of Natick, Mass. Such packages provide sophisticated software platforms with a rich suite of support tools that makes the analysis and design of dynamic systems efficient, methodical, and cost-effective.

Using the models or algorithms, an engineer or scientist can analyze the behavior of a circuit before the circuit is built. When the engineer or scientist determines the behavior of the circuit, then the models or algorithms are represented in Hardware Description Language (HDL) code to implement the circuit. HDL refers to any language from a class of computer languages for formal description of hardware. It can describe hardware operation, its design, and tests to verify its operation by means of simulation. HDL code is a standard text-based expression of the temporal behaviour and/or (spatial) structure of the hardware. HDL's syntax and semantics include explicit notations for expressing time and concurrency which are the primary attributes of hardware.

Using the hardware description in HDL code, a software program called an hardware synthesis tool can infer hardware logic operations from the hardware description statements and produce an equivalent netlist of generic hardware primitives to implement the specified behaviour. However, designing hardware systems in HDL code is generally difficult and as a result time consuming. Therefore, there is a need for a process for automatically generating HDL code for hardware systems.

SUMMARY OF THE INVENTION

The present invention provides systems, methods and computer program products for automatically generating HDL code from a model. The HDL code may be generated from a graphical program/model, such as a block diagram model. The HDL code may also be generated from a text-based program/model, such as a model created using MATLAB® tools. In particular, the present invention provides for the automatic code generation of interfaces between components in the model. The present invention may provide options for selecting types or styles of the component interfaces in the model. The selection of the interface types or styles can be controlled by the user or can be inferred by certain model parameters, such as power parameters, required throughput and/or clock parameters, and circuit area or size parameters. Once the interface types or styles are determined, HDL code for the component interfaces is automatically generated that comply with the determined interface types or styles.

In one aspect of the present invention, a method is provided for generating code from a model in a computing device. The method includes the step of determining an interface between a portion of a first component of the model and a portion of a second component of the model. The method also includes the step of automatically generating code representative of the interface between the portion of the first component and the portion of the second component of the model. When the code for the interface between the components of the model is compiled, an output of the compiler is used to implement the interface in a hardware component.

In another aspect of the present invention, a system is provided for generating code from a model. The system includes a user interface for enabling users to create the model. The system also includes a code generator for determining an interface between a portion of a first component of the model and a portion of a second component of the model. The code generator automatically generates code representative of the interface between the portion of the first component and the portion of the second component of the model. When the code for the interface between the components of the model is compiled, an output of the compiler is used to implement the interface in a hardware component.

In another aspect of the present invention, a computer program product is provided for holding instructions executable to perform a method in a computer. The method includes the step of determining an interface between a portion of a first component of the model and a portion of a second component of the model. The method also includes the step of automatically generating code representation of the interface between the portion of the first component and the portion of the second component of the model. When the code for the interface between the components of the model is compiled, an output of the compiler is used to implement the interface in a hardware component.

BRIEF DESCRIPTION OF THE DRAWINGS

The aforementioned features and advantages, and other features and aspects of the present invention, will become better understood with regard to the following description and accompanying drawings, wherein:

FIG. 7 is a table showing exemplary interfaces for the weighted combinations of implementation parameters.

DETAILED DESCRIPTION

Figure 1:
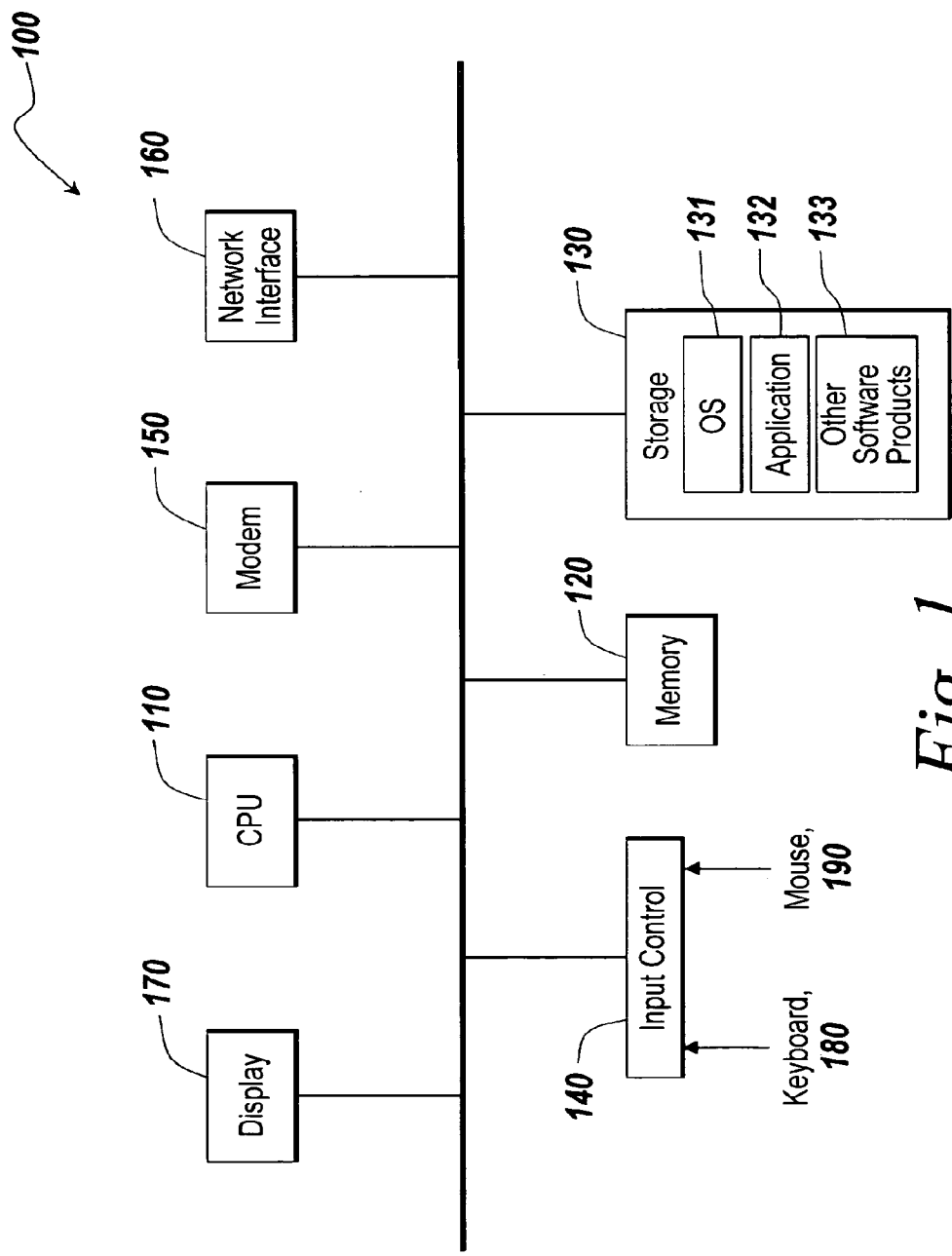
FIG. 1 is an exemplary computing device suitable for practicing the illustrative embodiment of the present invention.

Certain embodiments of the present invention are described below. It is, however, expressly noted that the present invention is not limited to these embodiments, but rather the intention is that additions and modifications to what is expressly described herein also are included within the scope of the invention. Moreover, it is to be understood that the features of the various embodiments described herein are not mutually exclusive and can exist in various combinations and permutations, even if such combinations or permutations are not made express herein, without departing from the spirit and scope of the invention.

The illustrative embodiment of the present invention provides for automatic code generation from a text-based or graphical program/model. The terms "program/programming" and "model/modeling" will be interchangeably used in the description of the illustrative embodiment. The illustrative embodiment automatically generates code for the hardware description of the program/model. The hardware description can be generated in Hardware Description Language (HDL) code, such as very high speed integrated circuit hardware description language (VHDL) code, SystemC code and Verilog code. Although the illustrative embodiment will be described below relative to HDL code, one of ordinary skill in the art will appreciate that the hardware description can be generated using other programming languages, such as C++, C and C#.

The HDL code can be generated from either a text-based or graphical program/model. As an exemplary graphical program/model, the illustrative embodiment will be described below solely for illustrative purposes relative to a block diagram model. One of ordinary skill in the art will appreciate that the block diagram model is illustrative and the present invention can apply to other graphical programs/models, such as data flow models, discrete-event models, and system-level modeling languages such as Unified Modeling Language (UML), as long as the graphical model has some notion of semantics that allows it to be transformed into an executable for a computer processor/microcontroller or directly synthesized in application-specific hardware.

An exemplary graphical program/model can be created in Simulink®, which provides tools for modeling and simulating a variety of dynamic systems in one integrated, graphical environment. Simulink® enables users to design a block diagram for a target system, simulate the system's behavior, analyze the performance of the system, and refine the design of the system. Simulink® allows users to design target systems through a user-interface that allows drafting of block diagram models of the target systems. All of the blocks in a block library provided by Simulink® and other programs are available to users when the users are building the block diagram of the target systems. Individual users may be able to customize this model to: (a) reorganize blocks in some custom format, (b) delete blocks they do not use, and (c) add custom blocks they have designed. The blocks can be copied from the block library on to the window (i.e., model canvas) through some human-machine interface (such as a mouse or keyboard).

The illustrative embodiment can also generate HDL code from a text-based program/model implemented using functional, object-oriented, or other design methodology. Such a model may be designed using, for example, textual object-oriented components provided by the Filter Design Toolbox from The MathWorks, Inc. of Natick, Mass. One of ordinary skill in the art will appreciate that the model designed using Filter Design Toolbox is illustrative and the present invention can apply to other text-based programs/models designed using other tools.

The Filter Design Toolbox provides tools and techniques for designing, simulating, and analyzing filters. The Filter Design Toolbox provides filter architectures and design methods for complex real-time DSP applications, including adaptive and multiple rate filtering. The Filter Design Toolbox also provides functions that simplify the design of fixed-point filters and the analysis of quantization effects. The Filter Design Toolbox enables users to generate HDL code, such as VHDL code and Verilog code, for fixed-point filters when it is used with the Filter Design HDL Coder, which will be described below in more detail with reference to FIG. 2.

The illustrative embodiment will be described below solely for illustrative purposes relative to a graphical program/model implemented using Simulink® and a text-based program/model implemented using Filter Design Toolbox. Nevertheless, those of skill in the art will appreciate that the present invention may be practiced relative to models implemented in other text-based or graphical programming/modeling tools, including but not limited to LabVIEW and Hyperception from National Instruments Corporation of Austin, Tex., Signal Processing Workbench (SPW) from CoWare, Inc. of San Jose, Calif., VisualSim from Mirabilis Design of Sunnyvale, Calif., and Rational Rose from IBM of White Plains, N.Y.

The illustrative embodiment of the present invention provides for the automatic HDL code generation for interfaces between components in a model. An interface between components refers to a collection of signals used to transfer information from one block to another block. There may be one or more subsets of the interface in which one or more signals are grouped. The interface between two components matches on both sides of the components. That is, the properties of the signals in the interface, such as the types, dimensions and sizes of the signals, on the side of one component are compatible with those of the signals on the side of the other component. The interface may include one or more signals that can be controlled by users and specifically depicted to the users in the model. The interface may also include one or more signals that are not controlled by the users and not specifically depicted to the users in the model, but are automatically added by design tools to control the transfer of the information between the components of the model.

Although one interface between two components of the model can be implemented in the real hardware of the model, multiple types or styles of the interface can be considered in the design process of the model. In the illustrative embodiment, options can be provided for selecting one or more types or styles of the component interfaces in the model. For example, in an exemplary block-diagram, one interface type or style can be configured to receive or transfer data every clock cycle. In another interface type or style, the transfer of data is flow-controlled by a clock-enable signal. The options may include many other interface types or styles. If multiple types or styles of the interface are available, the design tools may determine the final type or style of the interface using one or more selection criteria, such as a cost function, to achieve a user-specified goal such as low-power or high performance. In the description of the illustrative embodiment set forth below, the terms "interface types and "interface styles" are interchangeably used to refer to the interfaces having different characteristics of signals between components in a model.

With some guidance from the users, any of the interface types or styles could be created in the HDL code. Alternatively, the selection of interface types or styles can be inferred by certain model parameters, such as implementation parameters including power parameters, clock parameters and implementation area or size parameters. Once the interface types or styles are determined, HDL code for the component interfaces is automatically generated that comply with the determined interface types or styles. When the code for the interface between the components of the model is compiled by a compiler, an output of the compiler is used to implement the interface in a hardware component.

FIG. 1 is an exemplary computing device 100 suitable for practicing the illustrative embodiment of the present invention. One of ordinary skill in the art will appreciate that the computing device 100 is intended to be illustrative and not limiting of the present invention. The computing device 100 can be an electronic device including but not limited to a workstation, server, network computer, Internet appliance, mobile device, a pager, a tablet computer, and the like.

The computing device 100 includes a network interface 160, a modem 150, storage 130, memory 120, a central processing unit (CPU) 110, a display 170, an input control 140, a keyboard 180 and a mouse 190. One of ordinary skill in the art will appreciate that the computing device 100 may be connected to communication networks using the modem 150 and network interface 160. The network interface 160 and the modem 150 enable the computing device 100 to communicate with other computing devices through communication networks, such as the Internet, an intranet, a LAN (Local Area Network), a WAN (Wide Area Network) and a MAN (Metropolitan Area Network).

The CPU 110 controls each component of the computing device 100 to run software tools for generating HDL code from a model. The computing device 100 receives input commands necessary for generating HDL code, such as the selection of HDL code languages, through the keyboard 180 or mouse 190. The computing device 100 may display the options for the types or styles of the component interfaces in the model. The memory 120 temporarily stores and provides to the CPU 110 the code that need to be accessed by the CPU 110 to operate the computing device 100 and to run the software tools. The storage 130 usually contains software tools for applications. The storage 130 includes, in particular, code 131 for an operating system, code 132 for applications, such as a code generator 230 and code 133 for data including the model and HDL code generated from the model. The code generator 230 will be described below in more detail with reference to FIG. 2.

Figure 2:
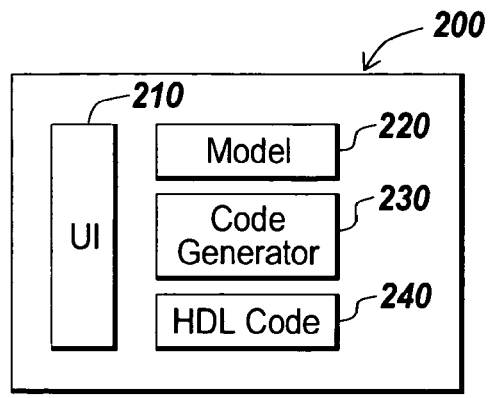
FIG. 2 is an exemplary environment for generating code from a model in the illustrative embodiment of the present invention.

FIG. 2 shows an exemplary environment 200 for generating HDL code 240 in the illustrative embodiment of the present invention. The environment 200 can be a modeling environment in which a model 220 can be created, simulated, executed and/or tested. The environment 200 can include a user interface 210 and a code generator 230. The user interface 210 can include a graphical user interface (GUI) and/or a command line interface (CLI) for allowing users to create the model 220 and enabling the code generator 230 to generate HDL code 240 from the model 220. The user interface 210 enables users to input data for the model 220. In particular, the user interface 210 can enable the users to input data necessary for generating the HDL code 240 from the model 220, such as data for selecting the language of the HDL code 240, such as VHDL code, SystemC code and Verilog code or other versions of HDL code. The user interface 210 may allow users to input parameters for selecting or defining the type or style of interfaces between the components in the model 220. The user interface 210 may also allow the users to input other parameters, such as implementation parameters including power parameters, clock parameters and implementation area or size parameters. The code generator 230 generates the HDL code 240 based on the data entered or selected by the users using the user interface 210.

An exemplary code generator 230 can be found in Filter Design HDL Coder from The Math Works, Inc. of Natick, Mass. The Filter Design HDL Coder generates HDL code and test benches for filters that users design and create. The Filter Design HDL Coder enables users to generate VHDL code or Verilog code for filters designed with the Filter Design Toolbox for implementation in application-specific integrated circuit (ASIC) or field programmable gate array (FPGA), or other hardware component. The Filter Design HDL Coder also automatically creates VHDL, Verilog, and ModelSim test benches for simulating, testing, and verifying the generated code. The test bench feature increases confidence in the correctness of the generated code and saves time spent on test bench implementation. The test bench will be described below in more detail with reference to FIG. 3. Using the Filter Design HDL Coder, system architects and designers can spend more time on fine-tuning algorithm and models through simulation and less time on HDL coding.

Figure 3:
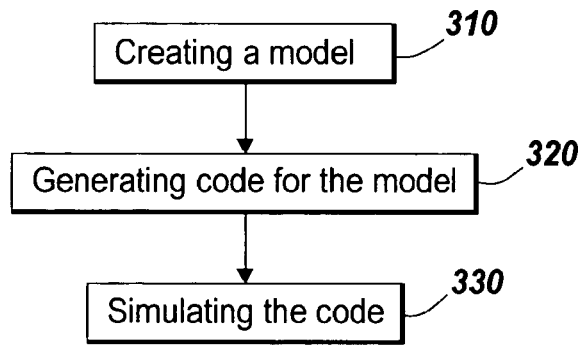
FIG. 3 is a flow chart showing an exemplary operation for generating code from a model in the illustrative embodiment of the present invention.

FIG. 3 depicts an exemplary operation for generating HDL code 240 from a model 220 in the illustrative embodiment of the present invention. The model 220 can be created using the user interface 210 in the environment 200 (step 310). The model 220 created in the environment 200 can be either a text-based or graphical model. The graphical model can be generated using a graphical model design tool, such as Simulink®. One of ordinary skill in the art will appreciate that the Simulink® is an illustrative modeling tool and the present invention may use other graphical model design tools, for example LabVIEW and Hyperception from National Instruments, Signal Processing WorkBench (SPW) from CoWare, VisualSim from Mirabilis Design, Rational Rose from IBM, etc. The text-based model can be generated using a text-based model design tool, such as Filter Design Toolbox. One of ordinary skill in the art will appreciate that the text-based model can be generated using other text-based model design tools.

Figure 4:
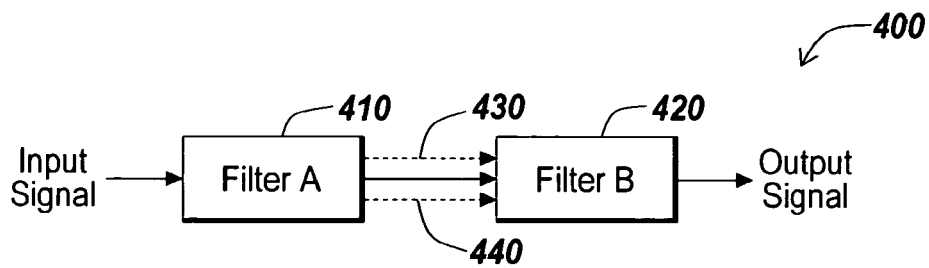
FIG. 4 shows an exemplary model from which hardware description language (HDL) code is generated in the illustrative embodiment of the present invention.

FIG. 4 is an exemplary model designed in the illustrative embodiment. The model 400 includes two components (or elements) including filter 410 and filter 420. The components of the model 400 depicted in FIG. 4 is illustrative and the model 400 can include more than two components or elements, and multiple interfaces for different portions of the model 400.

Referring back to FIG. 3, the code generator 230 generates HDL code 240 from the model 220 (step 320). When the HDL code 240 is generated for the model 240, such as the model 400 having filter 410 and filter 420 as its components, component interfaces between the components of the model 220 are also generated. Sometimes component interfaces have signals that are not specifically depicted to a user in the displayed representation of the model 400. Such signals may include, but are not limited to various types of control signals, for example:

(1) reset signal 430 (dotted line in FIG. 4);
(2) clock-enable signal 440 (dotted line in FIG. 4);
(3) bidirectional flow-control handshake signals; and
(4) other like control signals.

These signals are added to the component interfaces by the code generator 230 in the process of generating the HDL code from the model 220 to facilitate the synthesis of an actual hardware system, such as a FPGA and an ASIC. Those of ordinary skill in the art will appreciate that the control signals set forth above are illustrative and the component interfaces may include other signals that can be used to control data flow between components. The component interfaces include information representing signals transferred between the components, which are specifically depicted in the displayed representation of the model 400, and control signals performing the flow-control of data between the components.

Figure 5:
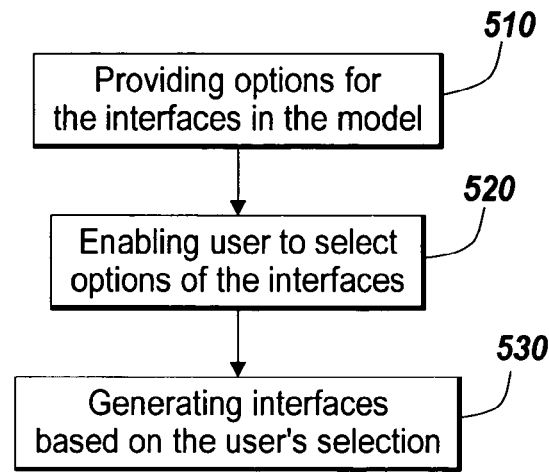
FIG. 5 is a flow chart showing an exemplary operation for generating interfaces between components or elements in the model depicted in FIG. 4.

FIG. 5 is a flow chart showing an exemplary operation for generating a component interface between filter 410 and filter 420 in the model 400. First, the environment 200 may provide users with options for selecting the types or styles of the component interfaces via the user interface 210 (step 510). The interface types or styles may define different characteristics for the component interfaces in the model 440. The interface types or styles may define how data is transferred between the components in the model. The options for the interface types or styles may include:

(1) an interface where the input and output data are transferred every clock cycle;
(2) an interface where the input data is transferred every clock cycle but the output is flow-controlled by an output enable signal;
(3) an interface where the input and output data transfer is flow-controlled by a clock enable input signal;
(4) an interface where the input and output data transfer is flow-controlled by a clock gating signal;
(5) a serial interface where the input and output data are transferred one bit per clock cycle; and
(6) an interface with a unidirectional flow-control;
(7) an interface with a bidirectional flow-control;
(8) an interface with a single clock;
(9) an interface with multiple clocks; and
(10) many other interface types or styles.

Those of ordinary skill in the art will appreciate that the interface types set forth above are illustrative and other types of interfaces can be may be included to define different characteristics for the interfaces.

The users may be able to select one or more options for the types or styles of the component interface between filter 410 and filter 420 in the model 400 (step 520). If multiple types or styles are selected, a final type or style of the interface can be determined using a balancing algorithm, such as a cost function, for the real hardware implementation of the model 400. In the illustrative embodiment, the selection of the interface types or styles may be directly controlled by the user using the user interface 210. In another embodiment, the selection of the interface types or styles may also be inferred from other parameters for the model 400.

One of ordinary skill in the art will appreciate that the model 400 is illustrative and the present invention may apply to a model that includes multiple interfaces for different portions of the model. One of ordinary skill in the art will also appreciate that the user interface 210 may enable the users to select options for the types or styles of the multiple interfaces.

Figure 6:
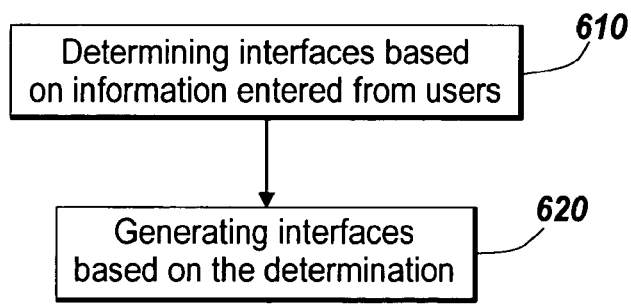
FIG. 6 is a flow chart showing another exemplary operation for generating interfaces between components or elements in the model depicted in FIG. 4.

FIG. 6 is a flow chart showing another exemplary operation for generating code for a component interface between filter 410 and filter 420 in the model 400. The selection of the interface types or styles may be inferred from other parameters for the model 400, such as implementation parameters that the users have entered (step 610). The HDL code 240 can be generated to comply with one or more implementation parameters including but not limited to:

(1) various power requirements;
(2) various clock rates;
(3) size constraints; and
(4) a weighted combination of implementation parameters.

The various power requirements may include the amount of power that can be consumed in the implemented hardware system, the amount of input power than can be handled by the implemented hardware system, the amount of output power than can be produced by the implemented hardware system or any other power requirements relating to the implemented hardware system. The various clock rates may include a high speed clock rate, a low speed clock rate or any specific clock rate that can determine the speed of the implemented hardware system. The size constraints may determine the area of the implemented hardware system. Those of skill in the art will appreciate that the HDL code 240 can be generated to comply with a weighted combination of one or more implementation parameters.

FIG. 7 depicts exemplary interfaces for the weighted combination of the implementation parameters. HDL code 240 for Interface A can be generated to increase the clock speed and decrease the power consumption while HDL code 240 for Interface B can be generated to increase the clock speed and decrease the implementation area. HDL code for Interface C can be generated to decrease the power consumption and the implementation area. Interfaces A, B and C have multiple types or styles, such as the clock speed, power consumption, and implementation area. A cost function that gives a cost measure can be used to determine the final type or style of the interface for the hardware implementation. Those skilled in the art will appreciate the implementation parameters listed above are illustrative and other parameters may be considered to determine the type or style of the component interface. Those skilled in the art will appreciate the combinations of the implementation parameters depicted in FIG. 7 are also illustrative and other combinations may be considered to determine the type or style of the component interface. If the users input the implementation parameters, the code generator 230 may determine the type or style of the component interface from the implementation parameters.

In a circuit implementation, goals may differ in different parts of the system. Thus, more than one goal may be specified for a given circuit, and different interface styles may be simultaneously employed within the circuit.

Referring back to FIGS. 5 and 6, if the type or style of the component interface is determined, the code generator 230 generates the HDL code 240 for the component interface between filter 410 and filter 420 based on the interface type or style (step 530 in FIG. 5 and step 620 in FIG. 6). In the process of generating the component interface that complies with the determined interface type or style, the attributes of filter 410 and filter 420 are propagated programmatically throughout the model 400. For each of the components, a method forces the component to evaluate all of its parameters. This method is called for all components in the model. During the propagation, the attributes of signals, such as reset signals and clock-enable signals, in the component interfaces are determined on the basis of the attributes of components that are connected to each other and the determined interface type or style. For example, the attributes of the interface between filter 410 and filter 420 are determined on the basis of the attributes of filter 410 and filter 420 and the interface type or style of the component interface between filter 410 and filter 420. One of ordinary skill in the art will appreciate that the component interface may be implemented using a data structure wherein the data structure is filled with the attributes of the component interface. An exemplary data structure is disclosed in a copending U.S. patent application Ser. No. 10/414,644 entitled "A SYSTEM AND METHOD FOR USING EXECUTION CONTEXTS IN BLOCK DIAGRAM MODELING," which is incorporated herewith by reference.

Referring back to FIG. 3, the generated HDL code 240 may be simulated to verify the results of the HDL code 240 (step 330). Users may simulate the HDL code 240 using a HDL code simulation tool, such as ModelSim from Mentor Graphics Corporation of Wilsonville, Oreg. The HDL code 240 may be verified using a test bench generated by the code generator 230. In order to verify the functionality of the generated HDL code, the code generator 230 may generate the test bench in many forms including: VHDL or Verilog HDL code written at a behavioral level; a Simulink® diagram; a MATLAB® function called via a co-simulation interface; a scripting language files such as a TCL file for the simulation tool; and an industry standard value-change-dump (VCD) file that gives inputs, outputs, and the times each are valid. To simulate the generated HDL code 240, users may start the simulation tool and compile the generated HDL code 240 and test bench files in the simulation tool. The test bench connects to top-level of the generated HDL code. The test bench drives the primary inputs for testing, such as sampled data for a filter or Ethernet packets, and the ancillary inputs for control, such as the clock, the reset, the clock enable and the control inputs. The test bench checks or verifies whether the outputs are the correct values at any or all instant of time.

It will thus be seen that the invention attains the objectives stated in the previous description. Since certain changes may be made without departing from the scope of the present invention, it is intended that all matter contained in the above description or shown in the accompanying drawings be interpreted as illustrative and not in a literal sense. For example, the illustrative embodiment of the present invention may be practiced in any other programming/modeling environment that provides for the synchronization of actions in a model. Practitioners of the art will realize that the sequence of steps and architectures depicted in the figures may be altered without departing from the scope of the present invention and that the illustrations contained herein are singular examples of a multitude of possible depictions of the present invention.

We claim:

1. A method comprising:
   receiving a selection of at least two interface types, from a plurality of interface types, for an interface between two components in a model,
   the interface comprising at least one signal between the two components, and
   the at least two interface types including:
      a first interface type including a first signal associated with a first parameter for the model, and
      a second interface type including a second signal associated with a second parameter for the model,
      the first parameter and second parameter being different;
   selecting, as an interface type, one of the first interface type or the second interface type based on the two components and based on the first parameter and the second parameter,
   selecting the one of the first interface type or the second interface type including:
      applying a cost function to parameters for the model to produce cost results,
      the parameters for the model including the at least one of:
         a size parameter,
         a power parameter, or
         a clock parameter, and
      selecting the one of the first interface type or the second interface type based on the produced cost results; and
   generating code representative of the selected interface type for the at least one signal included in the interface between the two components,
   the receiving, the selecting, and the generating being performed by a processor.

2. The method of claim 1, where the first parameter for the model is one of:
   a first size parameter for the model,
   a first clock parameter for the model, or
   a first power parameter for the model, and
   where the second parameter for the model is one of:
   a second size parameter for the model,
   a second clock parameter for the model, or
   a second power parameter for the model.

3. The method of claim 1, where the code comprises Hardware Description Language (HDL) code associated with the model.

4. The method of claim 1, where the model comprises one of:
   a graphical model including at least one block representation, or a text-based model.

5. The method of claim 1, where each of the first interface type and the second interface type further includes a data transfer parameter related to a data transfer between the two components of the model, and
   where selecting the interface type is further based on the data transfer parameter.

6. The method of claim 5, where the data transfer parameter is associated with the at least one signal,
   the at least one signal including at least one of:
      a reset signal,
      a clock signal, or
      a clock-enable signal, and
   the at least one signal being associated with controlling the data transfer between the two components of the model.

7. The method of claim 1, where the parameters for the model are associated with a hardware implementation of the model.

8. A system comprising:
   a processor to:
      receive information identifying two interface types from a plurality of possible interface types for an interface between two or more components of a model,
         a first interface type, of the two interface types, including a first signal associated with a first parameter for the model, and
         a second interface type, of the two interface types, including a second signal associated with a second parameter for the model,
         the second parameter differing from the first parameter,
      identify, based on the first parameter and the second parameter, one of the first interface type or the second interface type as an interface type for the interface,
      the processor, when identifying the one of the first interface type or the second interface type as the interface type, being further to:
         apply a cost function to at least one parameter of the model to produce cost results,
         the least one parameter of the model including at least one of:
            a size parameter,
            a power parameter, or
            a clock parameter, and identify the one of the first interface type or the second interface type further based on the produced cost results, and generate code representative of the interface based on the identified interface type.

9. The system of claim 8, where the generated code comprises Hardware Description Language (HDL) code.

10. The system of claim 8, where the model includes at least one of:
a graphical model having at least one block representation, or
a text-based model.

11. The system of claim 8, where each of the first interface type and the second interface type includes:
information associated with a data transfer between the two or more components of the model.

12. The system of claim 11, where the interface type includes:
a data structure that includes information on the data transfer between the two or more components of the model.

13. The system of claim 8, where the interface type includes one or more signals, the one or more signals including at least one of:
a reset signal associated with a data transfer between the two or more components of the model,
a clock signal associated with the data transfer, or
a clock-enable signal associated with the data transfer.

14. The system of claim 8, where the processor, when identifying the one of the first interface type or the second interface type as the interface type, is further to:
identify the one of the first interface type or the second interface type as the interface type based on one or more parameters associated with the model,
where the parameters include one or more hardware implementation parameters of the model.

15. A non-transitory computer readable medium to store instructions executable in at least one computer, the instructions comprising:
one or more instructions that, when executed by the at least one computer, cause the at least one computer to:
determine a plurality of interface types, each of the plurality of interface types being associated with a respective subset of a plurality of parameters;
identify one or more parameters associated with two components of a model,
the one or more parameters including at least one of:
a size parameter,
a clock parameter, or
a power parameter;
identify an interface type, from the plurality of interface types, based on the one or more parameters,
the respective subset of the plurality of parameters, associated with the identified interface type, corresponding to the one or more parameters, and
the one or more instructions to identify the interface type further including:
one or more instructions to apply a cost function to the one or more parameters of the model to produce cost results, and
one or more instructions to identify the interface type based on the produced cost results; and
generate code representative of an interface between the two components based on the identified interface type.

16. The non-transitory computer readable medium of claim 15, where the one or more parameters further include a data transfer parameter, and
where the one or more instructions to identify the interface type further include:
one or more instructions to identify the interface type further based on the data transfer parameter.

17. The non-transitory computer readable medium of claim 15, the instructions further comprising:
one or more instructions that, when executed by the at least one computer, cause the at least one computer to:
identify an interaction between the two components; and
configure the interface based on the identified interaction.

* * * * *